United States Patent
Hwang

(10) Patent No.: US 11,296,514 B2
(45) Date of Patent: Apr. 5, 2022

(54) APPARATUS AND METHOD FOR MANAGING BATTERY

(71) Applicant: LG Chem, Ltd., Seoul (KR)

(72) Inventor: Ji Won Hwang, Daejeon (KR)

(73) Assignee: LG Energy Solution, Ltd.

(*) Notice: Subject to any disclaimer, the term of this patent is extended or adjusted under 35 U.S.C. 154(b) by 11 days.

(21) Appl. No.: 16/969,620

(22) PCT Filed: Dec. 6, 2019

(86) PCT No.: PCT/KR2019/017211
§ 371 (c)(1),
(2) Date: Aug. 13, 2020

(87) PCT Pub. No.: WO2020/117000
PCT Pub. Date: Jun. 11, 2020

(65) Prior Publication Data
US 2021/0028631 A1    Jan. 28, 2021

(30) Foreign Application Priority Data

Dec. 7, 2018    (KR) .................. 10-2018-0157150

(51) Int. Cl.
*H02J 7/00*    (2006.01)
*G01R 31/396*    (2019.01)
(52) U.S. Cl.
CPC ........ *H02J 7/00032* (2020.01); *G01R 31/396* (2019.01); *H02J 7/0048* (2020.01)
(58) Field of Classification Search
CPC .................................................. H02J 7/00032
(Continued)

(56) References Cited

U.S. PATENT DOCUMENTS

| | | | |
|---|---|---|---|
| 9,000,935 B2* | 4/2015 | Dao | H04Q 9/00 340/636.1 |
| 2009/0115252 A1* | 5/2009 | Caraghiorghiopol | H02J 1/10 307/48 |

(Continued)

FOREIGN PATENT DOCUMENTS

| | | |
|---|---|---|
| EP | 3098895 A1 | 11/2016 |
| JP | H8139635 A | 5/1996 |

(Continued)

OTHER PUBLICATIONS

International Search Report for Application No. PCT/KR2019/017211, dated Mar. 16, 2020, pp. 1-2.

(Continued)

*Primary Examiner* — Yalkew Fantu
(74) *Attorney, Agent, or Firm* — Lerner, David, Littenberg, Krumholz & Mentlik, LLP

(57) ABSTRACT

A cell management controller including a first antenna capable of communicating with an external device using a first frequency, a second antenna capable of receiving a signal of a second frequency from the external device, a voltage generation unit configured to generate a voltage based on the signal of the second frequency received at the second antenna; a driving unit configured to receive a signal based on a voltage generated by the voltage generation unit as an enable signal, and a cell parameter measurement unit configured to measure a parameter indicating a state of a battery cell based on a control signal from the driving unit, wherein the driving unit transitions from a standby state to a wake-up state based on the enable signal.

16 Claims, 7 Drawing Sheets

(58) Field of Classification Search
USPC .......................................................... 320/134
See application file for complete search history.

(56) References Cited

U.S. PATENT DOCUMENTS

| | | |
|---|---|---|
| 2010/0073003 A1 | 3/2010 | Sakurai et al. |
| 2010/0176202 A1 | 7/2010 | Teraoka et al. |
| 2011/0051641 A1* | 3/2011 | Pan .................... H04Q 9/00 370/311 |
| 2011/0225436 A1* | 9/2011 | Beard ................ G06F 1/3296 713/310 |
| 2013/0252549 A1 | 9/2013 | Ogura et al. |
| 2013/0271072 A1 | 10/2013 | Lee et al. |
| 2014/0117939 A1 | 5/2014 | Lim |
| 2014/0229129 A1 | 8/2014 | Campbell et al. |
| 2014/0347014 A1 | 11/2014 | Lee et al. |
| 2014/0354291 A1 | 12/2014 | Kikuchi et al. |
| 2015/0028816 A1 | 1/2015 | Lee |
| 2015/0178526 A1 | 6/2015 | Roh et al. |
| 2016/0294019 A1* | 10/2016 | Yamauchi .............. H02J 5/00 |
| 2016/0325626 A1 | 11/2016 | Honda et al. |
| 2016/0327612 A1 | 11/2016 | Terada et al. |
| 2018/0093583 A1 | 4/2018 | Kim et al. |
| 2021/0336301 A1* | 10/2021 | Hwang ............... H01M 10/425 |

FOREIGN PATENT DOCUMENTS

| | | |
|---|---|---|
| JP | 2010081716 A | 4/2010 |
| JP | 2010142083 A | 6/2010 |
| JP | 2012222913 A | 11/2012 |
| JP | 2013541320 A | 11/2013 |
| JP | 5663748 B2 | 2/2015 |
| JP | 5677171 B2 | 2/2015 |
| JP | 6134397 B2 | 5/2017 |
| JP | 6171027 B2 | 7/2017 |
| JP | 6181211 B2 | 8/2017 |
| KR | 101276930 B1 | 6/2013 |
| KR | 20180010869 A | 1/2018 |
| KR | 20180020505 A | 2/2018 |
| KR | 20180037733 A | 4/2018 |
| KR | 101856663 B1 | 5/2018 |
| KR | 101891843 B1 | 9/2018 |
| WO | 2011125103 A1 | 10/2011 |
| WO | 2015092846 A1 | 6/2015 |
| WO | 2015107687 A1 | 7/2015 |
| WO | 2015121979 A1 | 8/2015 |

OTHER PUBLICATIONS

Extended European Search Report including Written Opinion for Application No. 19893934.0 dated Mar. 9, 2021, pp. 1-11.

* cited by examiner

APPARATUS AND METHOD FOR MANAGING BATTERY

CROSS-REFERENCE TO RELATED APPLICATIONS

The present application is a national phase entry under 35 U.S.C. § 371 of International Application No. PCT/KR2019/017211 filed Dec. 6, 2019, published in Korean, which claims priority from Korean Patent Application No. 10-2018-0157150, filed on Dec. 7, 2018, all of which are incorporated herein by reference.

TECHNICAL FIELD

The present invention relates to an apparatus and method for monitoring a state of a battery on a battery cell basis.

BACKGROUND ART

Recently, research and development on secondary batteries have been actively conducted. Here, the secondary batteries are batteries that can be charged and discharged, and include conventional Ni/Cd batteries and Ni/MH batteries, and recent lithium ion batteries. Among the secondary batteries, the lithium ion battery has an advantage that the energy density is much higher than that of the conventional Ni/Cd battery and Ni/MH battery. Further, the lithium ion battery can be manufactured with a tendency of a small size and a light weight so that it is used as a power source for a mobile apparatus. In addition, the usage range of the lithium ion battery extends as a power source for electric vehicles, so that the lithium ion battery attracts attention as a next generation energy storage medium.

Secondary batteries are generally used in battery systems consisting of a plurality of battery packs. The battery packs constituting the battery system are configured as a plurality of battery modules are connected in series or in parallel, and each battery module may include a plurality of battery cells. A state and an operation of such a battery system are managed and controlled by a battery management system (BMS). The BMS includes a battery management controller (BMC) corresponding to a master and a plurality of cell management controllers (CMCs) for controlling a plurality of battery packs respectively. Then, a state of each battery module included in the battery pack and each battery cell included therein are monitored by the corresponding CMC and collected by the BMC, such that the battery system is monitored by the BMS.

Therefore, in order for the BMS to accurately determine the state of the battery cells, it is necessary to operate the BMC and the CMCs efficiently.

SUMMARY OF THE INVENTION

Technical Problem

An object of the present invention is to enable the CMC to communicate efficiently with the BMC without waking up periodically when BMC and CMC communicate wirelessly, in conventional battery management systems.

It is also an object of the present invention to provide a safe path to deliver the fault state of the battery module monitored by the CMC.

Technical Solution

A cell management controller according to an embodiment of the present invention includes: a first antenna configured to transmit a first signal of a first frequency to an external device; a second antenna configured to receive a second signal of a second frequency from the external device; a voltage generator configured to generate a voltage based on the signal of the second frequency received at the second antenna; a controller configured to receive an enable signal based on a voltage generated by the voltage generator; and a cell parameter sensor configured to measure a parameter indicating a state of a battery cell based on a control signal from the controller, wherein the controller is configured to transition from a standby state to a wake-up state based on the enable signal.

In this embodiment, the first frequency and the second frequency may be different frequencies or may be the same frequency.

In this embodiment, the second signal may have a higher energy density than the first signal.

In this embodiment, the signal of the second frequency may be a CW signal.

In this embodiment, the cell management controller may further include an impedance matching circuit configured to match an impedance to receive the second signal at the second antenna.

In this embodiment, the cell management controller may further include a discharge circuit configured to discharge an energy accumulated in the voltage generator.

In this embodiment, the driving unit may be configured to determine whether the battery cell is abnormal based on a parameter value of the battery cell received from the cell parameter sensor, and when it is determined that an abnormality occurs in the battery cell, transmit a fault signal indicating an abnormal state of the battery cell to the external device at a third frequency.

In this embodiment, the first frequency and the third frequency may be different frequencies or may be the same frequency.

In this embodiment, the fault signal may have a higher energy density than the first signal.

In this embodiment, the signal of the third frequency may be a CW signal.

In this embodiment, the first antenna may be configured to transmit the fault signal.

In this embodiment, the cell management controller may further include a power supply circuit configured to supply power to the controller, wherein the power supply circuit may be further configured to apply the enable signal to the controller when the voltage generated by the voltage generator is inputted, wherein the controller may be configured to transition to a wakeup state based on the enable signal applied from the power supply circuit.

In this embodiment, the cell management controller may further include a power supply circuit configured to supply power to the controller, wherein the power supply circuit may be configured to continuously supply power to the controller, wherein the controller may be configured to receive the voltage generated by the voltage generator as the enable signal.

A battery management controller according to another embodiment of the present invention includes: a first antenna configured to communicate with an external device using a first frequency and a second frequency; and a controller configured to generate a wake-up signal of the second frequency for transitioning the external device from a standby state to a wake-up state, transmit the signal to the external device through the first antenna, and perform data transmission and reception with the external device using the first frequency, wherein the controller is configured to generate signals of the first frequency at a first energy density and signals of the second frequency at a second energy density that is greater than the first energy density.

In this embodiment, the battery management controller may further include a second antenna configured to receive a signal of a third frequency from the external device, wherein the controller may be configured to determine that an abnormality occurs in a battery cell monitored by the external device when the signal of the third frequency is received from the second antenna.

In this embodiment, when the controller may be configured to detect receiving the signal of the third frequency having an energy equal to or greater than a predetermined reference from the second antenna, and determine that an abnormality has occurred in the battery cell monitored by the external device based on receiving the signal of the third frequency having an energy equal to or greater than a predetermined reference.

In this embodiment, the battery management controller may further include: an impedance matching circuit configured to match an impedance so that the second antenna is capable of receiving the signal of the third frequency; and a discharge circuit configured to discharge an energy accumulated by the signal received through the impedance matching circuit.

A battery management system according to another embodiment of the present invention includes: a plurality of cell management controllers, each cell management controller configured to monitor a state of a corresponding battery cell; and a battery management controller configured to communicate with each of the plurality of cell management controllers to receive, from each cell management controller, a respective parameter value measured for the corresponding battery cell, wherein each of the plurality of cell management controllers includes a first antenna configured to communicate with the battery management controller using a first frequency, a second antenna configured to receive a signal of a second frequency from the battery management controller, a voltage generator configured to generate a voltage based on the signal of the second frequency received at the second antenna, a controller configured to receive an enable signal based on the voltage generated by the voltage generator, and a cell parameter sensor configured to measure a parameter indicating a state of the corresponding battery cell based on a control signal from the driving unit, wherein the controller is configured to transition from a standby state to a wake-up state based on the enable signal.

In this embodiment, in each of the plurality of cell management controllers, the controller may be configured to determine whether the corresponding battery cell is abnormal based on a parameter value of the corresponding battery cell received from the cell parameter sensor, and when it is determined that an abnormality occurs in the battery cell, transmit a fault signal indicating an abnormal state of the battery cell to the battery management controller at a preset third frequency that is different from the preset third frequencies of the other cell management controllers.

In this embodiment, the battery management controller may be configured to scan a frequency range that includes the preset third frequencies at which the plurality of cell management controllers are configured to transmit respective fault signals and receive one or more of the fault signals from the plurality of cell management controllers.

Advantageous Effects

According to one aspect of the invention, the standby power of the CMC can be implemented close to "0", thereby reducing battery current consumption to prevent battery discharge.

According to one aspect of the present invention, the fault signal can be delivered to the BMC without adding an RF module. In addition, according to one aspect of the present invention, the fault signal can be delivered immediately.

DETAILED DESCRIPTION

Figure 1:
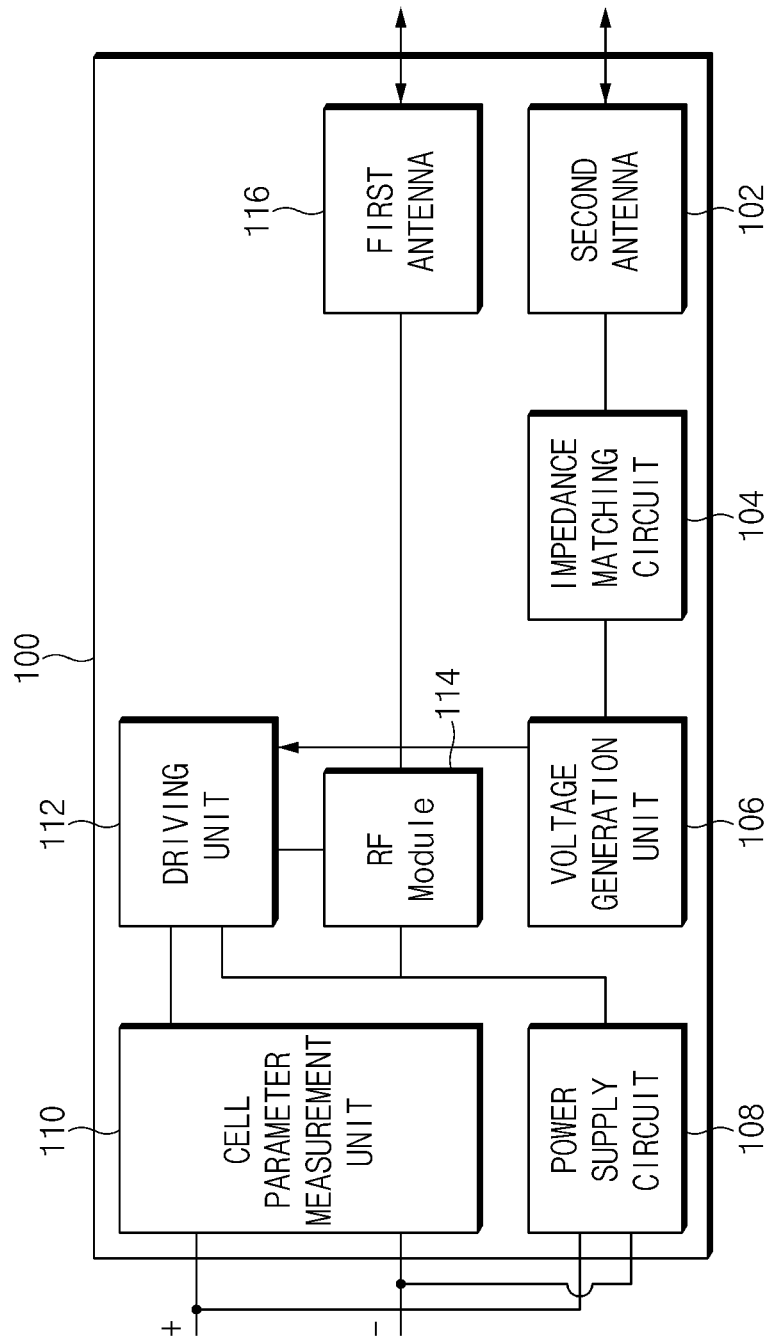
FIG. 1 is a schematic diagram of a cell management controller according to an embodiment of the present invention.

Hereinafter, some embodiments of the present invention will be described in detail through exemplary drawings. It should be noted that, in assigning reference numerals to components of each drawing, although the components are displayed on different drawings, like reference numerals refer to like components. Additionally, in describing the inventive concept, detailed descriptions of well-known configurations or functions will be omitted if it is determined that they would obscure the subject matter of the inventive concept.

In order to manage the state and performance of the battery in the conventional BMS, when a battery management controller (BMC) corresponding to a master receives an operation start command from a higher level controller, the BMC wakes up cell management controller (CMC) which is a lower lever controller corresponding to a slave to start monitoring of the parameters indicating the battery state such as the voltage or temperature of the battery cell to which the corresponding CMC is connected. Here, the BMC and the CMCs are modules included in the BMS.

In the conventional wireless communication between the BMC and the CMC, since it is not wired, the CMC wakes up continuously or periodically to receive a wake up signal from the BMC, while continually consuming current. Due to the continuous current consumption of the CMC, unnecessary current is consumed, which may cause battery discharge in the future.

Thus, in order to receive a signal for checking the battery state from the BMC, there is a need for a more efficient and current-saving method than a method in which the CMC periodically wakes up.

Also, for safety, after the CMC checks the state of the battery cell (checks the state of the battery cell by measuring the voltage and temperature of the battery cell), if it is determined that there is a problem with the state of the battery cell (or module), various paths are required to deliver fault signals to the BMC. The configuration and operation method of the present invention for solving this problem will be described below.

First, a cell management controller 100 according to an embodiment of the present invention will be described with reference to FIG. 1.

FIG. 1 is a schematic diagram of the cell management controller 100 according to an embodiment of the present invention.

The cell management controller 100 includes a second antenna 102, an impedance matching circuit 104, a voltage generation unit 106, a power supply circuit 108, a cell parameter measurement unit 110, a driving unit 112, an RF module 114, and a first antenna 116.

Here, the type of the battery is not particularly limited and the battery may be, for example, a lithium ion battery, a lithium polymer battery, a nickel cadmium battery, a nickel hydrogen battery, a nickel zinc battery, or the like.

In addition, the battery is formed of a battery module in which a plurality of battery cells are connected in series and/or in parallel, and the plurality of battery modules are connected in series and/or in parallel to form a battery pack. The battery may include one or more battery packs.

The second antenna 102 receives an RF signal having a second frequency from an external device, for example, a BMC. Unlike the second antenna 102, the first antenna 116 may receive an RF signal having a first frequency from an external device and perform general communication. The RF signal received at the second antenna 102 is impedance matched through the impedance matching circuit 104. That is, the impedance matching circuit 104 selects an RF signal having a second frequency, which is a pre-matched frequency, from the received RF signals and delivers the RF signal to the voltage generation unit 106.

The RF signal received from the external device at the second antenna 102 is delivered to the voltage generation unit 106.

The voltage generation unit 106 receiving the RF signal from the second antenna 102 generates a voltage using the received RF signal. That is, the voltage generation unit 106 generates a voltage based on the RF signal having the second frequency received at the second antenna 102. The RF signal having the second frequency received by the second antenna 102 has a higher energy density than the RF signal having the first frequency transmitted and received by the first antenna 116 to communicate with the BMC. This is because a voltage that can be used as an enable signal to be described later should be generated based on the RF signal having the second frequency. The RF signal having this second frequency may be a signal that does not include data. That is, the RF signal having the second frequency may be an un-modulated signal. For example, the RF signal having the second frequency may be a continuous wave (CW) signal. That is, the RF signal having the second frequency may simply be a signal for transmitting energy of a predetermined energy density or more to the cell management controller 100.

The voltage generation unit 106 may be, for example, a multistage rectifier circuit. However, since it is difficult to generate a voltage enough to transition the driving unit 112 to the wake-up state with the received RF signal, it may be implemented in multistage up to the required voltage to form a high voltage. That is, in the multistage rectifier circuit, the number of the stage may be adjusted according to the voltage to be generated from the RF signal having the second frequency.

The voltage generation unit 106 may include a plurality of diodes and a plurality of capacitors to form a multistage rectifier circuit. The diode may be, for example, an RF diode having a low threshold voltage Vf and a high state transition speed of the diode for fast rectification and high voltage formation.

When the voltage generation unit 106 receives the RF signal and generates a voltage, the driving unit 112 is enabled by detecting it. That is, the driving unit 112 receives a signal based on the voltage generated by the voltage generation unit as an enable signal. At this time, the driving unit 112 receives the power from the power supply circuit 108. The driving unit 112 may be, for example, a micro controller unit (MCU) that controls each of the components in the cell management controller 100. The MCU is a core chip that is adopted in most electronic products and serves as the brain of electronic products and is a non-memory semiconductor (system semiconductor) that controls the various characteristics of the product, from simple time reservations to special functions.

The driving unit 112 enabled by receiving the enable signal from the power supply circuit 108 enables the RF module 114.

The cell parameter measurement unit 110 is connected to the battery and measures a parameter indicating the state of the battery cell based on the control signal received by the driving unit 112. The parameter representing the state of the battery cell may be at least one of voltage or temperature. Although the cell parameter measurement unit 110 is illustrated as one component in this drawing, the cell parameter measurement unit 110 may be configured as separate components, that is, the cell voltage measurement unit and the cell temperature measurement unit. Data on the voltage and temperature of the cell measured by the cell parameter measurement unit 110 is transmitted to the driving unit 112.

Based on the parameter value of the battery cell received from the cell parameter measurement unit 110, the driving unit 112 determines whether the battery cell is abnormal. That is, the driving unit 112 that receives data on the voltage and temperature of the cell from the cell parameter measurement unit 110 determines whether the measured voltage and temperature of the cell are within a range of normal operation of the cell. For example, if the measured cell voltage is greater than the first threshold or less than the second threshold, the driving unit 112 determines that there is a problem with the state of the cell. If it is determined in the driving unit 112 that the state of the cell is problematic, it allows the RF module 114 to generate the fault signal of the preset frequency. Also, for example, if the measured cell temperature is greater than the third threshold, the driving unit 112 determines that there is a problem with the state of the cell. If the driving unit 112 determines that there is a problem with the state of the cell, it allows the RF module 114 to generate a fault signal. That is, when it is determined that an abnormality has occurred in the battery cell, a fault signal indicating an abnormal state of the battery cell is transmitted to an external device at a third frequency different from the first frequency.

At this time, like the signal at the second frequency, the signal transmitted at the third frequency also has a higher energy density than the RF signal having the first frequency that is transmitted and received to communicate with the BMC. This is because a voltage must be generated in the battery management controller (BMC) based on the RF signal having the third frequency. Then, the fault signal, which is an RF signal having a third frequency, may be a signal that does not include data. That is, the RF signal having the third frequency may be an un-modulated signal. For example, the RF signal having the third frequency may be a continuous wave (CW) signal. That is, the fault signal may simply be a signal for delivering energy of a predetermined energy density or more to the BMC.

In the present embodiment, the driving unit 112 and the cell parameter measurement unit 110 are described as being separate components, but these are exemplary and they may be implemented in one integrated component.

The driving unit 112 enables the RF module 114 when the driving unit 112 receives an enable signal based on the voltage generated by the voltage generation unit 106. Further, when the driving unit 112 determines that there is a problem in the state of the cell, and receives the fault signal generation signal from the driving unit 112, the RF module 114 generates a fault signal having a third frequency and transmits the fault signal to the first antenna 116.

The first antenna 116 receives the fault signal from the RF module 114. The first antenna 116 that receives the fault signal from the RF module 114 transmits the fault signal to an external device, for example, the BMC. That is, the fault signal is transmitted through the first antenna. The first antenna 116 is an antenna that generally communicates with the BMC, in addition to transmitting a fault signal to the BMC.

Meanwhile, although not shown in the drawing, a discharge circuit for discharging the energy accumulated in the multistage rectifier circuit, which is the voltage generation unit 106, may be further included. In the multistage rectifier circuit, some energy may be accumulated by signals other than the signal of the second frequency or noise. If the accumulated energy becomes more than a certain degree, the voltage generation unit 106 generates a voltage even when the RF signal of the second frequency is not received, thereby causing the driving unit 112 to be enabled. Therefore, it is necessary to discharge periodically or when the energy accumulated in the multistage rectifier circuit satisfies a predetermined condition (for example, when the accumulated energy is above the reference value).

Figure 2:
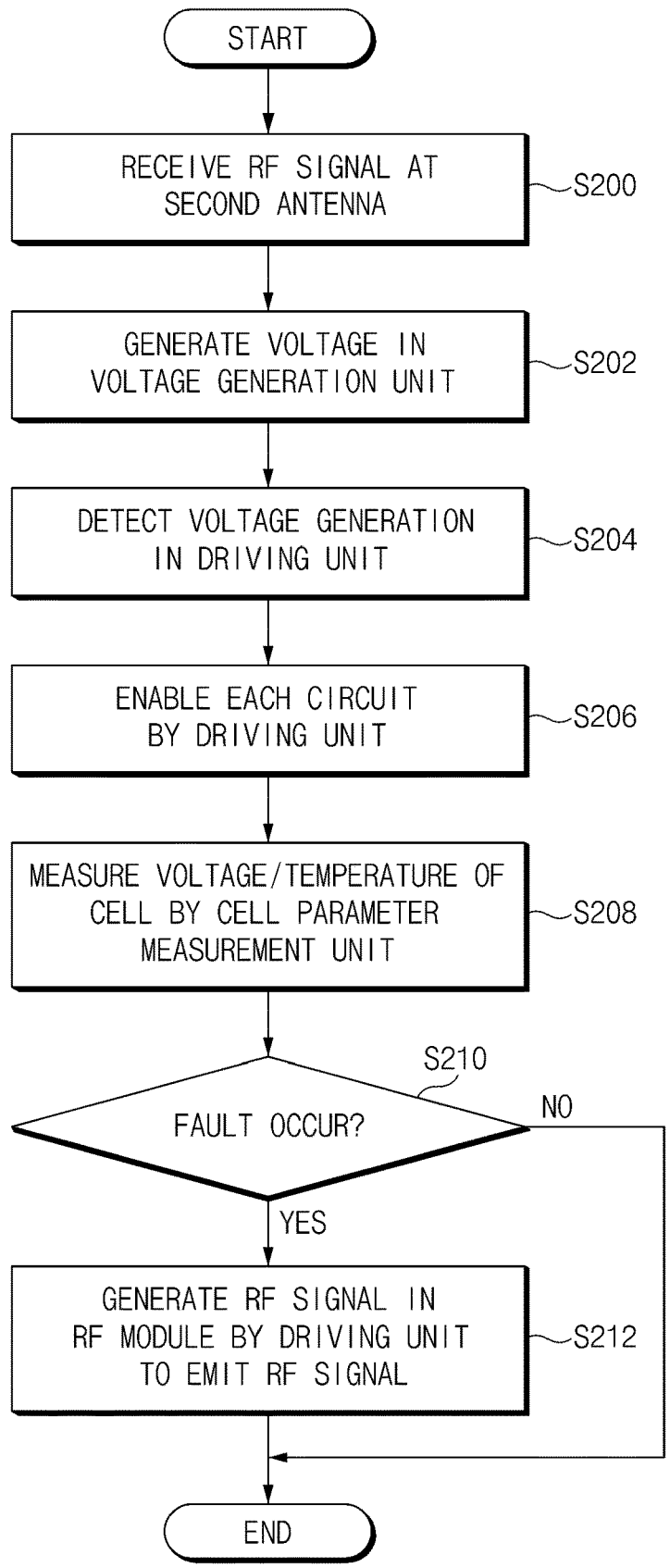
FIG. 2 is a simplified flowchart of a battery state monitoring method according to an embodiment of the present invention.

FIG. 2 is a simplified flowchart of a battery state monitoring method according to an embodiment of the present invention.

Since the cell management controller 100 consumes only the power required for the MCU to latch until receiving the RF signal from the BMC, the cell management controller 100 can wait while consuming only standby power close to "0". That is, since the cell management controller 100 operates after receiving the RF signal, it does not need to wake up periodically before receiving the RF signal.

The cell management controller 100 is in a standby state, and the second antenna 102 receives an RF signal having a second frequency from an external device, for example, a BMC (S200). At this time, the impedance matching circuit 104 selects an RF signal of a pre-matched frequency from the RF signals received from the second antenna 102 and delivers the RF signal to the voltage generation unit 106.

The RF signal received from the BMC at the second antenna 102 is delivered to the voltage generation unit 106. The voltage generation unit 106 that receives the RF signal from the second antenna 102 generates a voltage for transmitting the enable signal to the driving unit 112 (S202).

The voltage generation unit 106 may be, for example, a rectifier circuit. However, since the rectifier circuit constituting the voltage generation unit 106 has difficulties in generating a voltage enough for generating and transmitting an enable signal to the driving unit 112 using the received RF signal, up to the voltage required for forming high voltage can be implemented in multistage.

The voltage generation unit 106 may include a plurality of diodes and a plurality of capacitors to form a multistage rectifier circuit. The diode may be, for example, an RF diode having a low threshold voltage Vf and a high state transition speed of the diode for fast rectification and high voltage formation.

When the voltage generation unit 106 receives the RF signal and generates a voltage, the driving unit 112 detects this (S204). That is, the driving unit 112 receives an enable signal based on the voltage generated by the voltage generation unit 106. The driving unit 112 that detects the voltage generated by the voltage generation unit 106 is enabled to enable each circuit in the cell management controller 100 (S206). The driving unit 112 may be, for example, an MCU that controls each of the components in the cell management controller 100.

That is, the driving unit 112 enables the RF module 114. The power supply circuit 108 receiving the enable signal from the driving unit 112 receives current from the battery and supplies power to the RF module 114. In this embodiment, the driving unit 112 receives a minimum of continuous power from the power supply circuit 108. The cell parameter measurement unit 110 may be powered directly from the battery or may be powered from the power supply circuit 108.

The cell parameter measurement unit that receives the cell parameter measurement signal (control signal) from the driving unit 112 measures the voltage and temperature of the cell (S208). The cell parameter measurement unit 110 is connected to the battery cell to measure the voltage and temperature of the battery cell. The cell parameter measurement unit 110 measures the voltage and temperature of the battery cell and transmits the voltage and temperature data of the cell to the driving unit 112.

The driving unit 112 that receives the voltage and temperature data of the cell measured by the cell parameter measurement unit 110 determines whether a problem occurs in the battery cell based on the received voltage and temperature data of the cell (S210).

For example, if the measured voltage of the cell is greater than the first threshold or less than the second threshold, the driving unit 112 determines that there is a problem in the state of the cell. Also, if the measured cell temperature is greater than the third threshold, the driving unit 112 determines that there is a problem with the state of the cell.

If it is determined that the state of the cell is a problem in the driving unit 112, this allows the RF module 114 to generate a fault signal and transmit the fault signal to the external device through the first antenna 116 (S212). The fault signal is a signal having a different frequency from the RF signal received by the second antenna. In addition, a fault signal is a signal having a frequency that is impedance matched in an external device.

If the driving unit 112 determines that the state of the cell is not a problem, the driving unit 112 terminates the operation and enters the standby mode again. However, even when it is determined that the state of the cell is not a problem, the driving unit 112 may allow the RF module 114 to generate a signal having a frequency different from that of the fault signal. This can be set in advance.

Figure 3:
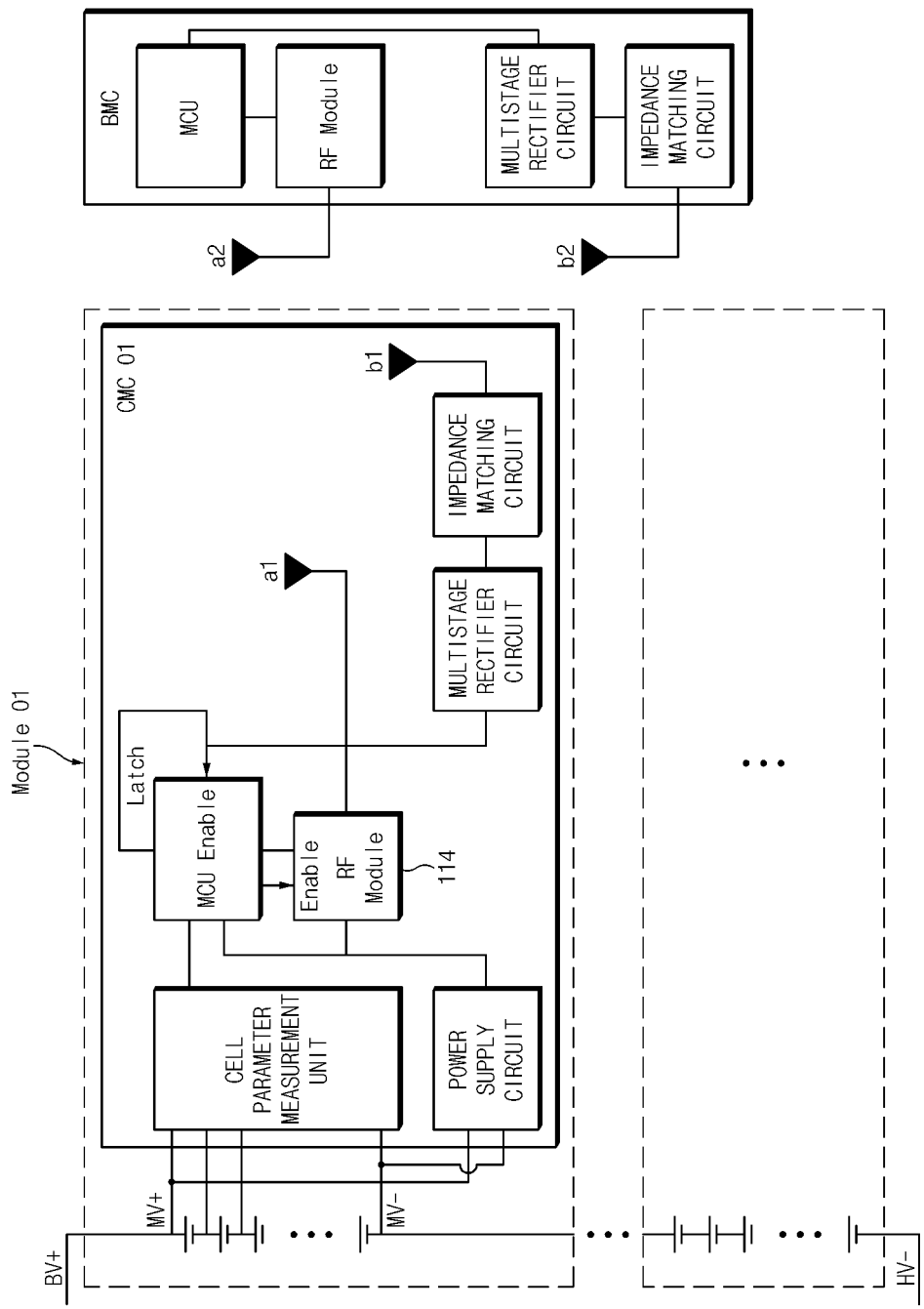
FIG. 3 is a schematic diagram of a cell management controller and a battery management controller according to an embodiment of the present invention.

FIG. 3 is a schematic diagram of a CMC and a BMC according to an embodiment of the present invention. The CMC is a module that monitors/manages the state of battery cells and modules. The BMC is a module that diagnoses, estimates, and manages battery state based on information from the CMC.

The CMC module connected to each battery includes a first antenna a1, a second antenna b1, an impedance matching circuit, a multistage rectifier circuit, an MCU, an RF module, a cell parameter measurement unit, and a power supply circuit.

In addition, the BMC includes a first antenna a2, a second antenna b2, an MCU, an RF module, a multistage rectifier circuit, and an impedance matching circuit. As described above, the CMC and the BMC may further include a discharge circuit for discharging the energy accumulated in the multistage rectifier circuit.

The MCU of the BMC allows the RF module to generate an RF signal having a second frequency and transmit the RF signal to the CMC module using the first antenna a2. That is, the control unit of the BMC generates a wake-up signal for transitioning the CMC from the standby state to the wake-up state as a signal having a second frequency so that it transmits the signal to the CMC through the first antenna a2 and performs general data transmission/reception with the CMC using an RF signal having a first frequency. The RF signal transmitted through the first antenna a2 of the CMC is received by the second antenna b1 and then, frequency-matched by the impedance matching circuit and transmitted to the MCU.

The signal having the second frequency is not a signal for data communication between the CMC and the BMC. Since the signal having the second frequency only transitions from the standby state to the wake-up state, there is no need to include commands or data in the signal. Instead, since an enable signal that enables the MCU to transition to the wake-up state should be generated by using the signal having the second frequency, it is necessary to have a predetermined energy density. That is, the energy density of the signal having the second frequency should be greater than the energy density of the signal having the first frequency used when the CMC and the BMC communicate. In other words, the signal having the second frequency is mainly intended for the delivery of energy, not for transmission of data.

When the second antenna b1 receives the RF signal from the first antenna a2, the multistage rectifier circuit generates a voltage. However, since it is difficult to generate a voltage enough to transition the MCU to the wake-up state with the received RF signal, it can be configured in multistage up to the required voltage for high voltage formation.

The multistage rectifier circuit may include a plurality of diodes and a plurality of capacitors. The diode may be, for example, an RF diode having a low threshold voltage Vf and a high state transition speed of the diode for fast rectification and high voltage formation.

The rectified multistage circuit receives the RF signal and generates a voltage to transmit the enable signal to the MCU, and the MCU detects the signal and is enabled. The MCU receives only minimal power from the power supply circuit and waits for an enable signal. The enabled MCU enables each circuit.

The MCU enables the RF module. The power supply circuit, which receives the enable signal from the MCU, is enabled to receive current from the battery and supply the power to the MCU and RF module.

The cell parameter measurement unit is connected to the battery and measures the voltage and temperature of the connected battery. Although the cell parameter measurement unit is illustrated as one component in this drawing, the cell parameter measurement unit 110 may be configured as separate components, that is, the cell voltage measurement unit and the cell temperature measurement unit. Data on the voltage and temperature of the cell measured by the cell parameter measurement unit is transmitted to the MCU.

The MCU that receives data on the voltage and temperature of the cell from the cell parameter measurement unit determines whether the measured voltage and temperature of the cell are within a range of normal operation of the cell. For example, if the measured voltage of the cell is greater than the first threshold or less than the second threshold, the MCU determines that there is a problem in the state of the cell. If the MCU determines that there is a problem with the state of the cell, it allows the RF module to generate a fault signal. Also, for example, if the measured cell temperature is greater than the third threshold, the MCU determines that there is a problem with the state of the cell. If the MCU determines that there is a problem with the state of the cell, it allows the RF module to generate a fault signal.

When the MCU detects the voltage generated by the multistage rectifier circuit and is enabled, the RF module is enabled by receiving the enable signal from the MCU. Further, when the MCU determines that there is a problem in the state of the cell, and receives the fault signal generation signal from the MCU, the RF module 114 generates a fault signal and transmits the fault signal to the first antenna a1. The fault signal has a different frequency than the RF signal received at the second antenna b1.

The first antenna a1 receives a fault signal from the RF module. The first antenna a1 that receives the fault signal from the RF module transmits the corresponding fault signal to the BMC. The fault signal has a third frequency that is different from the first frequency and the second frequency. Here, the signal having the third frequency is not a signal having data. The signal having the third frequency only needs to notify the BMC that the battery cell is not normal. Thus, it is not necessary to include commands or data in the signal. Instead, it must be able to detect that a signal having a third frequency is received at the BMC, so it needs to have a predetermined energy density. That is, the energy density of the signal having the third frequency should be greater than the energy density of the signal having the first frequency used when the CMC and the BMC communicate. In other words, the transmission of a signal having a third frequency is primarily for notifying that a particular event occurs through the delivery of energy.

The second antenna b2 of the BMC receives the fault signal transmitted from the CMC. The frequency of the fault signal is set in advance and is a signal matched by the impedance matching circuit of the BMC, and is received at the second antenna b2.

The fault signal received through the second antenna b2 of the BMC may be detected by the MCU of the BMC to determine that a problem occurs in the battery cell monitored by the corresponding CMC. That is, when the control unit of the BMC receives the signal having the third frequency from the second antenna b2, the control unit of the BMC determines that an abnormality occurs in the battery cell monitored by the CMC.

The first antenna a1 receives a fault signal from the RF module. The first antenna a1 that receives the fault signal from the RF module transmits the fault signal to the BMC.

In addition, the first antenna a1 of the CMC is used as a communication path for performing general communication using an RF signal having a first frequency with the first antenna a2 of the BMC. Then, the first antenna a1 of the CMC transmits a fault signal having a third frequency to the second antenna b2 of the BMC. In addition, the second antenna b1 of the CMC receives a wake-up signal from the first antenna a2 of the BMC.

Figure 4:
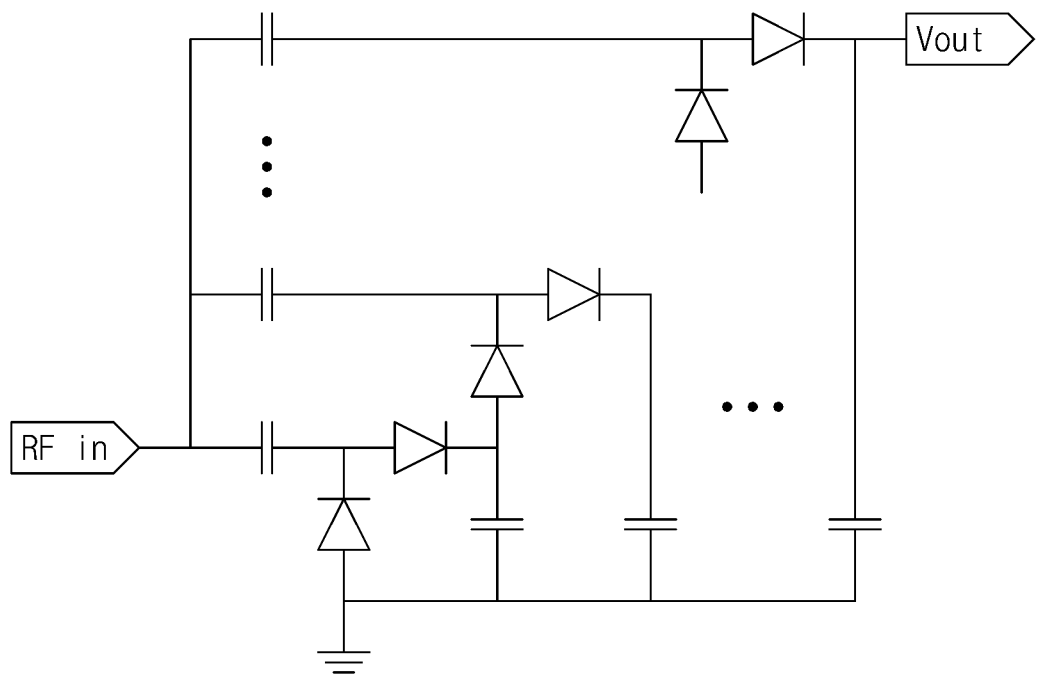
FIG. 4 illustrates an implementation of a multistage rectifier circuit according to an embodiment or another embodiment of the present invention.

FIG. 4 illustrates an implementation of a multistage rectifier circuit according to an embodiment of the present invention.

A multistage rectifier circuit that receives an RF signal and generates a voltage can be implemented in multistage up to the required voltage to form a high voltage.

The multistage rectifier circuit includes a plurality of diodes and a plurality of capacitors. One end of each capacitor is connected in parallel to an input terminal to which an RF signal is input, and one end of each diode connected in parallel is connected to the other end of each capacitor. Additional capacitor is connected to the other end of one of the diodes connected in parallel to the other end of each capacitor. In addition, a voltage is outputted from the other end of the diode connected to the other end of the capacitor connected to the most end among the capacitors connected in parallel to the input terminal to which the RF signal is inputted.

The multistage may be implemented according to the number of capacitors connected in parallel to the input unit, and the number of multistages may be adjusted and implemented according to the desired voltage.

In addition, the diode included in the multistage rectifier circuit may be an RF diode having a low threshold voltage and a fast state transition speed for fast rectification and high voltage formation.

In addition, the multistage rectifier circuit shown in FIG. 4 is just an example, and other multistage rectifier circuits may be applied.

Meanwhile, the CMC and the BMC according to FIGS. 1 to 4 may operate in different ways with respect to the first to third frequencies. Hereinafter, another operation method based on the CMC and BMC configurations of FIG. 3 will be described.

As an example of another operation scheme, frequencies of the first frequency signal and the second frequency signal may be the same. Signals used while performing data communication or command transmission are low in energy density, so that it is difficult to generate the voltage required for circuit components to operate. Therefore, in order to generate the voltage used for the enable signal to transition the MCU of the CMC to the wake-up state, the RF signal must have a predetermined energy density. Therefore, instead of changing the frequencies of the first frequency signal and the second frequency signal, the energy density of each signal may be changed in order to distinguish signals into a signal for communication and a signal for wake-up.

As another example of another operation scheme, frequencies of the first frequency signal and the third frequency signal may be the same. The third frequency signal does not need to transmit data because the third frequency signal is a fault signal, and the BMC only needs to know that the third frequency signal is received. That is, a predetermined energy may be only delivered from the CMC to the BMC. Therefore, like the case of the second frequency signal, the third frequency signal may distinguish the signal for communication from the fault signal by changing the energy density of each signal instead of changing the frequency.

As such, when the frequencies in the first frequency signal and the second frequency signal are the same, the BMC needs only one RF module, thereby saving cost and installation space. In addition, as such, when the frequencies in the first frequency signal and the third frequency signal are the same, the CMC needs only one RF module, thereby saving cost and installation space.

Figure 5:
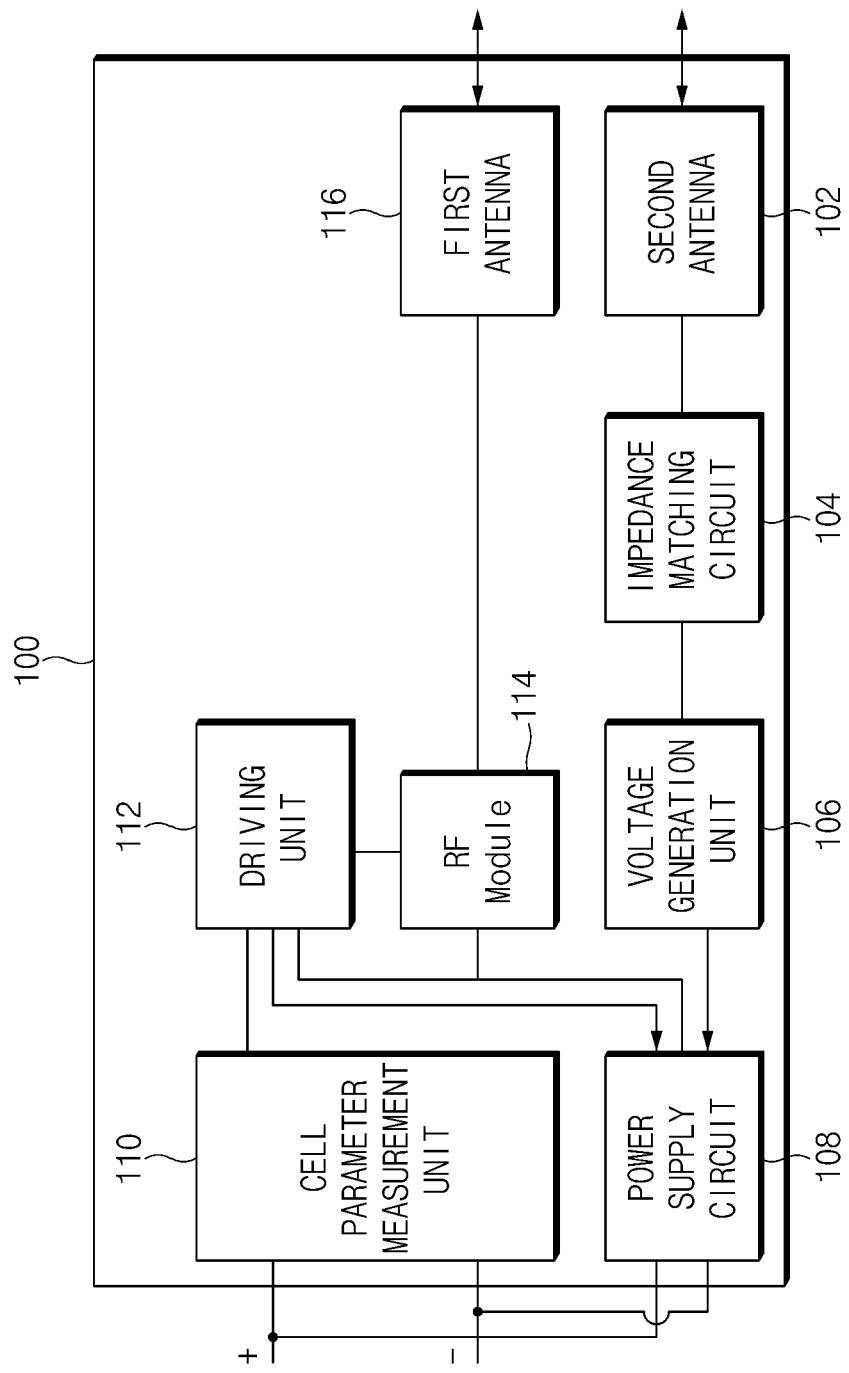
FIG. 5 is a schematic diagram of a cell management controller according to another embodiment of the present invention.

FIG. 5 is a schematic diagram of a cell management controller according to another embodiment of the present invention.

The cell management controller 100 includes a second antenna 102, an impedance matching circuit 104, a voltage generation unit 106, a power supply circuit 108, a cell parameter measurement unit 110, a driving unit 112, an RF module 114, and a first antenna 116.

Here, the type of the battery is not particularly limited and the battery may be, for example, a lithium ion battery, a lithium polymer battery, a nickel cadmium battery, a nickel hydrogen battery, a nickel zinc battery, or the like.

In addition, the battery is formed of a battery module in which a plurality of battery cells are connected in series and/or in parallel, and the plurality of battery modules are connected in series and/or in parallel to form a battery pack. The battery may include one or more battery packs.

The second antenna 102 receives an RF signal having a second frequency from an external device, for example, a BMC. An RF signal having a frequency matched by the impedance matching circuit 104 among the RF signals received by the second antenna 102 is delivered to the voltage generation unit 106. That is, the impedance matching circuit 104 selects an RF signal having a pre-matched second frequency among the RF signals received through the second antenna 102 and transmits the RF signal to the voltage generation unit 106.

The voltage generation unit 106 receiving the RF signal from the second antenna 102 generates a voltage using the received RF signal. That is, the voltage generation unit 106 generates a voltage based on the RF signal having the second frequency received at the second antenna 102. The RF signal having the second frequency received by the second antenna 102 has a higher energy density than the RF signal having the first frequency transmitted and received by the first antenna 116 to communicate with the BMC. The RF signal having this second frequency may be a signal that does not include data. That is, the RF signal having the second frequency may be an un-modulated signal. For example, the RF signal having the second frequency may be a continuous wave (CW) signal. That is, the RF signal having the second frequency may simply be a signal for transmitting energy of a predetermined energy density or more to the cell management controller 100.

The voltage generation unit 106 may be, for example, a multistage rectifier circuit. However, since it is difficult to generate a voltage enough to transition the driving unit 112 to the wake-up state with the received RF signal, it may be implemented in multistage up to the required voltage to form a high voltage. That is, in the multistage rectifier circuit, the number of the stage may be adjusted according to the voltage to be generated from the RF signal having the second frequency.

The voltage generation unit 106 may include a plurality of diodes and a plurality of capacitors to form a multistage rectifier circuit. The diode may be, for example, an RF diode having a low threshold voltage Vf and a high state transition speed of the diode for fast rectification and high voltage formation.

When the voltage generation unit 106 receives the RF signal and generates a voltage, the power supply circuit 108 is enabled by detecting it. In other words, the voltage generated by the voltage generation unit 106 becomes an enable signal for enabling the power supply circuit 108. The power supply circuit applies an enable signal to the driving unit 112 when the voltage generated by the voltage generation unit is inputted. The enabled power supply circuit 108 enables each circuit. The power supply circuit 108 is enabled to supply power to each circuit configuration, driving unit 112, and RF module 114 within the cell management controller 100.

The driving unit 112 that receives the power from the power supply circuit 108 transitions to the wake up state based on the enable signal applied from the power supply circuit 108. The woken-up driving unit 112 transmits a control signal to the cell parameter measurement unit 110 to measure the voltage or temperature of the cell.

The cell parameter measurement unit 110 is connected to the battery and measures a parameter indicating the state of the battery cell based on the control signal received by the driving unit 112. The parameter representing the state of the battery cell may be at least one of voltage or temperature. Although the cell parameter measurement unit 110 is illustrated as one component in this drawing, the cell parameter measurement unit 110 may be configured as separate components, that is, the cell voltage measurement unit and the cell temperature measurement unit. Data on the voltage and temperature of the cell measured by the cell parameter measurement unit 110 is transmitted to the driving unit 112.

Based on the parameter value of the battery cell received from the cell parameter measurement unit 110, the driving unit 112 determines whether the battery cell is abnormal. That is, the driving unit 112 that receives data on the voltage and temperature of the cell from the cell parameter measurement unit 110 determines whether the measured voltage and temperature of the cell are within a range of normal operation of the cell. For example, if the measured cell voltage is greater than the first threshold or less than the second threshold, the driving unit 112 determines that there is a problem with the state of the cell. If the driving unit 112 determines that there is a problem with the state of the cell, it allows the RF module 114 to generate a fault signal. Also, for example, if the measured cell temperature is greater than the third threshold, the driving unit 112 determines that there is a problem with the state of the cell. If the driving unit 112 determines that there is a problem with the state of the cell, it allows the RF module 114 to generate a fault signal. That is, when it is determined that an abnormality has occurred in the battery cell, a fault signal indicating an abnormal state of the battery cell is transmitted to an external device at a third frequency different from the first frequency.

At this time, like the signal at the second frequency, the signal transmitted at the third frequency also has a higher energy density than the RF signal having the first frequency that is transmitted and received to communicate with the BMC. Then, the fault signal, which is an RF signal having a third frequency, may be a signal that does not include data. That is, the RF signal having the third frequency may be an un-modulated signal. For example, the RF signal having the third frequency may be a continuous wave (CW) signal. That is, the fault signal may simply be a signal for delivering energy of a predetermined energy density or more to the BMC.

The RF module 114 is powered from the power supply circuit 108 and is enabled by the driving unit 112. Further, when the driving unit 112 determines that there is a problem in the state of the cell, and receives the fault signal generation signal from the driving unit 112, the RF module 114 generates a fault signal having a third frequency and transmits the fault signal to the first antenna 116.

The first antenna 116 receives the fault signal from the RF module 114. The first antenna 116 that receives the fault signal from the RF module 114 transmits the fault signal to an external device, for example, the BMC. The first antenna 116 is an antenna that generally communicates with the BMC, in addition to transmitting a fault signal to the BMC.

Furthermore, although not shown in the drawing, a discharge circuit for discharging the energy accumulated in the multistage rectifier circuit may be further included. The discharge circuit discharges the energy periodically or when the energy accumulated in the multistage rectifier circuit satisfies a predetermined condition (for example, when the accumulated energy is above the reference value).

Figure 6:
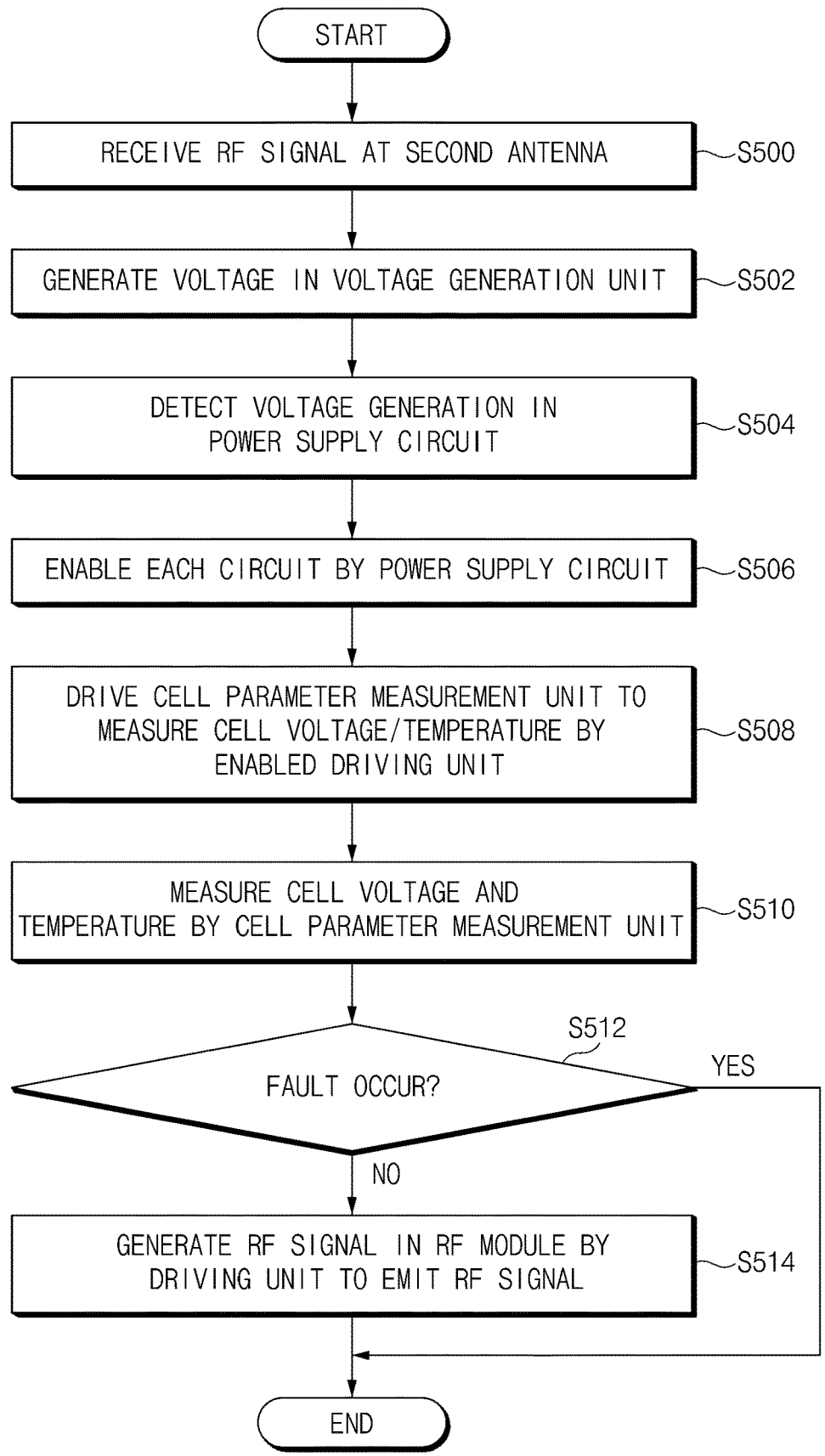
FIG. 6 is a simplified flowchart of a battery state monitoring method according to another embodiment of the present invention.

FIG. 6 is a simplified flowchart of a battery state monitoring method according to another embodiment of the present invention.

Since the cell management controller 100 operates after receiving the RF signal through the second antenna b1, there is no need to wake up periodically to receive the signal from the BMC before receiving the RF signal.

The cell management controller 100 is in a normal standby state, and the second antenna 102 receives an RF signal from an external device, for example, a BMC (S500).

Among the RF signals received by the second antenna 102, only the RF signal having a frequency matched by the impedance matching circuit 104 is transmitted to the voltage generation unit 106.

The RF signal received from the BMC at the second antenna 102 is delivered to the voltage generation unit 106. The voltage generation unit 106 that receives the RF signal from the second antenna 102 generates a voltage for transitioning the power supply circuit 108 to the wake-up state (S502). At this time, the enable signal is applied to the power supply circuit 108 based on the generated voltage.

The voltage generation unit 106 may be, for example, a multistage rectifier circuit. However, since it is difficult to generate a voltage enough to transition the power supply circuit 108 to the wake-up state with the received RF signal, it may be implemented in multistage up to the required voltage to form a high voltage.

The voltage generation unit 106 may include a plurality of diodes and a plurality of capacitors to form a multistage rectifier circuit. The diode may be, for example, an RF diode having a low threshold voltage Vf and a high state transition speed of the diode for fast rectification and high voltage formation.

When the voltage generation unit 106 receives the RF signal to generate a voltage, the power supply circuit 108 receives the voltage and is enabled (S504). The power supply circuit 108 enabled by the voltage generated by the voltage generation unit 106 enables each circuit in the cell management controller 100 by supplying power (S506). The driving unit 112 may be, for example, an MCU that controls each of the components in the cell management controller 100.

The driving unit 112 that receives the enable signal and transitions to the wake-up state transmits the cell voltage and temperature measurement signal (control signal) to the cell parameter measurement unit 110 to measure the cell voltage and temperature (S508). The cell parameter measurement unit driven by the driving unit 112 measures the voltage and temperature of the cell (S510). The cell parameter measurement unit 110 is connected to the battery cell to measure the voltage and temperature of the battery cell. The cell parameter measurement unit 110 measures the voltage and temperature of the battery cell and transmits the voltage and temperature data to the driving unit 112.

The driving unit 112 that receives the voltage and temperature data of the cell measured by the cell parameter measurement unit 110 determines whether a problem occurs in the battery cell based on the received voltage and temperature data of the cell (S512).

For example, if the measured voltage of the cell is greater than the first threshold or less than the second threshold, the driving unit 112 determines that there is a problem in the state of the cell. Also, if the measured cell temperature is greater than the third threshold, the driving unit 112 determines that there is a problem with the state of the cell.

If it is determined that the state of the cell is a problem in the driving unit 112, this allows the RF module 114 to generate a fault signal having a third frequency and transmit the fault signal to the external device through the first antenna 116 (S514). This fault signal is a signal that is impedance-matched in advance in an external device, for example, the BMC.

If the driving unit 112 determines that the state of the cell is not a problem, the driving unit 112 terminates the driving and enters the standby mode again. However, even when it is determined that the state of the cell is not a problem, the driving unit 112 may allow the RF module 114 to generate a signal having a frequency different from that of the fault signal. This can be set in advance.

Figure 7:
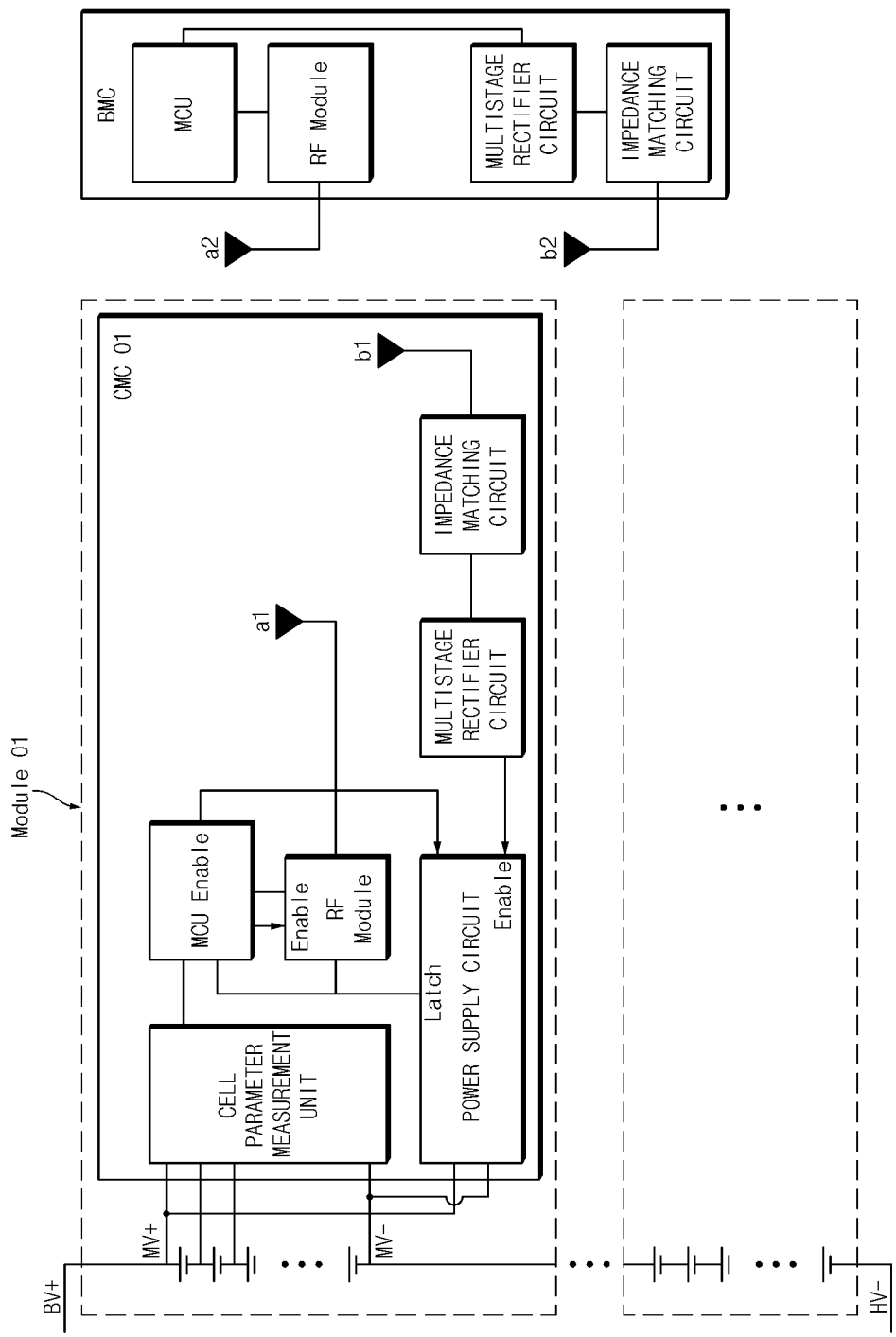
FIG. 7 is a schematic diagram of a cell management controller and a battery management controller according to another embodiment of the present invention.

FIG. 7 is a schematic diagram of a CMC and a BMC according to another embodiment of the present invention.

The CMC module connected to each battery includes a first antenna a1, a second antenna b1, an impedance matching circuit, a multistage rectifier circuit, an MCU, an RF module, a cell parameter measurement unit, and a power supply circuit.

In addition, the BMC includes a first antenna a2, a second antenna b2, an MCU, an RF module, a multistage rectifier circuit, and an impedance matching circuit. As described above, the CMC and the BMC may further include a discharge circuit for discharging the energy accumulated in the multistage rectifier circuit.

The MCU of the BMC allows the RF module to generate an RF signal having a second frequency and transmit the RF signal to the CMC module using the first antenna a2. That is, the control unit of the BMC generates a wake-up signal for transitioning the CMC from the standby state to the wake-up state as a signal having a second frequency so that it transmits the signal to the CMC through the first antenna a2 and performs data transmission/reception with the CMC using an RF signal having a first frequency. The RF signal has a predetermined frequency. The RF signal transmitted through the first antenna a2 of the CMC is received by the second antenna b1, and a signal that is frequency matched by the impedance matching circuit is selected and delivered to the multistage rectifier circuit.

As in the above embodiment, the signal having the second frequency is not a signal for data communication between the CMC and the BMC. Since the signal having the second frequency is only for the transitions of the CMC from the standby state to the wake-up state, there is no need to include commands or data in the signal. Instead, since an enable signal that enables the power supply circuit to transition to the wake-up state should be generated by using the signal having the second frequency, it is necessary to have a predetermined energy density. That is, the energy density of the signal having the second frequency should be greater than the energy density of the signal having the first frequency used when the CMC and the BMC communicate. In other words, the signal having the second frequency is mainly intended for the delivery of energy, not for transmission of data.

When the second antenna b1 receives the RF signal from the first antenna a2, the multistage rectifier circuit generates a voltage. However, since it is difficult to generate a voltage enough to wake up the power supply circuit with the received RF signal, it can be configured in multistage up to the required voltage for high voltage formation.

The multistage rectifier circuit may include a plurality of diodes and a plurality of capacitors. The diode may be, for example, an RF diode having a low threshold voltage Vf and a high state transition speed of the diode for fast rectification and high voltage formation.

When the rectified multistage circuit receives the RF signal and generates a voltage, the power supply circuit detects it as an enable signal (or receives the generated voltage) and is enabled to supply power to each circuit. In other words, the power supply circuit enables the components, the MCU, and the RF module of each circuit.

The MCU that receives the enable signal from the power supply circuit allows the cell parameter measurement unit to measure the voltage and temperature of a cell.

The cell parameter measurement unit is connected to the battery and measures the voltage and temperature of the connected battery. Although the cell parameter measurement unit is illustrated as one component in this drawing, the cell parameter measurement unit 110 may be configured as separate components, that is, the cell voltage measurement unit and the cell temperature measurement unit. Data on the voltage and temperature of the cell measured by the cell parameter measurement unit is transmitted to the MCU.

The MCU that receives data on the voltage and temperature of the cell from the cell parameter measurement unit determines whether the measured voltage and temperature of the cell are within a range of normal operation of the cell. For example, if the measured voltage of the cell is greater than the first threshold or less than the second threshold, the MCU determines that there is a problem in the state of the cell. If the MCU determines that there is a problem with the state of the cell, it allows the RF module to generate a fault signal. Also, for example, if the measured cell temperature is greater than the third threshold, the MCU determines that there is a problem with the state of the cell. If the MCU determines that there is a problem with the state of the cell, it allows the RF module to generate a fault signal.

The RF module is enabled when the MCU receives the enable signal from the power supply circuit and transmits the enable signal again to the RF module. Further, when the MCU determines that there is a problem in the state of the cell, and receives the fault signal generation signal from the MCU, the RF module 114 generates a fault signal having the third frequency and transmits the fault signal to the first antenna a1.

The first antenna a1 receives a fault signal from the RF module. The first antenna a1 receiving the fault signal from the RF module transmits the corresponding fault signal to the BMC. Here, the signal having the third frequency is not a signal having data. The signal having the third frequency only needs to notify the BMC that the battery cell is not normal. Thus, it is not necessary to include commands or data in the signal. Instead, it must be able to detect that a signal having a third frequency is received at the BMC, so it needs to have a predetermined energy density. That is, the energy density of the signal having the third frequency should be greater than the energy density of the signal having the first frequency used when the CMC and the BMC communicate. In other words, the transmission of a signal having a third frequency is primarily for notifying that a particular event occurs through the delivery of energy.

The second antenna b2 of the BMC receives the fault signal transmitted from the CMC. The frequency of the fault signal is set in advance and is a signal matched by the impedance matching circuit of the BMC, and is received at the second antenna b2.

The fault signal received through the second antenna b2 of the BMC may be detected by the MCU of the BMC to determine that a problem occurs in the battery cell monitored by the corresponding CMC. That is, when the control unit of the BMC receives the signal having the third frequency from the second antenna b2, the control unit of the BMC determines that an abnormality occurs in the battery cell monitored by the CMC. Since the fault signal is intended for notification of event detection through energy transmission, when the MCU of the BMC detects receiving a signal of a third frequency having the energy of a predetermined reference or more from the second antenna b2, it may determine that an abnormality occurs in the battery cell monitored by the CMC.

In addition, the first antenna a1 of the CMC is used as a communication path for performing general communication using an RF signal having a first frequency with the first antenna a2 of the BMC. Then, the first antenna a1 of the CMC transmits a fault signal having a third frequency to the second antenna b2 of the BMC. In addition, the second antenna b1 of the CMC receives an RF signal, which is a wake-up signal, from the second antenna b2 of the BMC.

As in the case of the embodiment according to FIGS. 1 to 4, it will be understood that the CMC and the BMC according to FIGS. 5 to 7 may operate even when the first to third frequencies are the same frequency. That is, when the first to third frequencies are the same frequency, the signal of the second frequency and the signal of the third frequency may achieve the object of the present invention by varying the energy density.

In addition, as shown in FIGS. 4 and 7, the following modifications may be considered when the BMC manages a plurality of CMCs.

Each of the plurality of CMCs has the same configuration. However, when the CMC detects an abnormality in the battery cell monitored by the CMC, the frequency of the fault signal transmitted to the BMC is set differently. That is, the third frequencies in the signal having the third frequency for fault signal transmission are different for each CMC.

In addition, the BMC must monitor which CMC among the plurality of CMCs transmits a fault signal in addition to communicating with the plurality of CMCs at a first frequency. In other words, it is not known which CMC the fault signal is transmitted from, so it is necessary to scan all frequencies of targets. Thus, the MCU of the BMC scans a frequency range that includes different third frequencies at which the plurality of CMCs will transmit a fault signal, such as by adjusting the impedance of the impedance matching circuit.

Due to this configuration, the BMC can immediately identify in which CMC an abnormality occurs. That is, since the BMC can determine the frequency at which the fault signal is received, even if the fault signal does not include other information, the BMC can specify the CMC that transmits the fault signal.

Although the present invention has been described above by limited embodiments and drawings, the present invention is not limited thereto, and it will be apparent to those skilled in the art that the present invention may be implemented in various ways within the equivalent scope of the technical spirit of the present invention and the claims to be described below.

The invention claimed is:

1. A cell management controller comprising:
a first antenna configured to transmit a first signal of a first frequency to an external device;
a second antenna configured to receive a second signal of a second frequency from the external device;
a voltage generator configured to generate a voltage based on the signal of the second frequency received at the second antenna;
a controller configured to receive an enable signal based on a voltage generated by the voltage generator; and
a cell parameter sensor configured to measure a parameter indicating a state of a battery cell based on a control signal from the controller,
wherein the controller is configured to transition from a standby state to a wake-up state based on the enable signal.

2. The cell management controller of claim 1, wherein the second signal has a higher energy density than the first signal.

3. The cell management controller of claim 1, further comprising an impedance matching circuit configured to match an impedance to receive the second signal at the second antenna.

4. The cell management controller of claim 3, further comprising a discharge circuit configured to discharge an energy accumulated in the voltage generator.

5. The cell management controller of claim 1, wherein the controller is configured to:
determine whether the battery cell is abnormal based on a parameter value of the battery cell received from the cell parameter sensor, and
when it is determined that an abnormality occurs in the battery cell, transmit a fault signal indicating an abnormal state of the battery cell to the external device at a third frequency.

6. The cell management controller of claim 5, wherein the fault signal has a higher energy density than the first signal.

7. The cell management controller of claim 5, wherein the first antenna is configured to transmit the fault signal.

8. The cell management controller of claim 1, further comprising a power supply circuit configured to supply power to the controller,
wherein the power supply circuit is further configured to apply the enable signal to the controller when the voltage generated by the voltage generator is inputted,
wherein the controller is configured to transition to a wakeup state based on the enable signal applied from the power supply circuit.

9. The cell management controller of claim 1, further comprising a power supply circuit configured to supply power to the controller,
wherein the power supply circuit is configured to continuously supply power to the controller,
wherein the controller is configured to receive the voltage generated by the voltage generator as the enable signal.

10. A battery management controller comprising:
a first antenna configured to communicate with an external device using a first frequency and a second frequency; and
a controller configured to generate a wake-up signal of the second frequency for transitioning the external device from a standby state to a wake-up state, transmit the signal to the external device through the first antenna, and perform data transmission and reception with the external device using the first frequency, wherein the controller is configured to generate signals of the first frequency at a first energy density and signals of the second frequency at a second energy density that is greater than the first energy density.

11. The battery management controller of claim 10, further comprising a second antenna configured to receive a signal of a third frequency from the external device,
wherein the controller is configured to determine that an abnormality occurs in a battery cell monitored by the external device when the signal of the third frequency is received from the second antenna.

12. The battery management controller of claim 11, wherein the controller is configured to:
detect receiving the signal of the third frequency having an energy equal to or greater than a predetermined reference from the second antenna; and
determine that an abnormality has occurred in the battery cell monitored by the external device based on receiving the signal of the third frequency having an energy equal to or greater than a predetermined reference.

13. The battery management controller of claim 11, further comprising:
an impedance matching circuit configured to match an impedance so that the second antenna is capable of receiving the signal of the third frequency; and
a discharge circuit configured to discharge an energy accumulated by the signal received through the impedance matching circuit.

14. A battery management system comprising:
a plurality of cell management controllers, each cell management controller configured to monitor a state of a corresponding battery cell; and
a battery management controller configured to communicate with each of the plurality of cell management controllers to receive, from each cell management controller, a respective parameter value measured for the corresponding battery cell,
wherein each of the plurality of cell management controllers comprises:
a first antenna configured to communicate with the battery management controller using a first frequency;
a second antenna configured to receive a signal of a second frequency from the battery management controller;
a voltage generator configured to generate a voltage based on the signal of the second frequency received at the second antenna;
a controller configured to receive an enable signal based on the voltage generated by the voltage generator; and
a cell parameter sensor configured to measure a parameter indicating a state of the corresponding battery cell based on a control signal from the driving unit,
wherein the controller is configured to transition from a standby state to a wake-up state based on the enable signal.

15. The battery management system of claim 14, wherein in each of the plurality of cell management controllers,
the controller is configured to:
determine whether the corresponding battery cell is abnormal based on a parameter value of the corresponding battery cell received from the cell parameter sensor, and
when it is determined that an abnormality occurs in the battery cell, transmit a fault signal indicating an abnormal state of the battery cell to the battery management controller at a preset third frequency that is different from the preset third frequencies of the other cell management controllers.

16. The battery management system of claim 15, wherein the battery management controller is configured to:
scan a frequency range that includes the preset third frequencies at which the plurality of cell management controllers are configured to transmit respective fault signals; and
receive one or more of the fault signals from the plurality of cell management controllers.

* * * * *